US012720974B2

(12) United States Patent
Bae

(10) Patent No.: US 12,720,974 B2
(45) Date of Patent: Aug. 25, 2026

(54) DISPLAY APPARATUS

(71) Applicant: Samsung Display Co., Ltd., Yongin-Si (KR)

(72) Inventor: Joonwoo Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 645 days.

(21) Appl. No.: 18/132,969

(22) Filed: Apr. 11, 2023

(65) Prior Publication Data

US 2024/0099082 A1 Mar. 21, 2024

(30) Foreign Application Priority Data

Sep. 15, 2022 (KR) ........................ 10-2022-0116641

(51) Int. Cl.

| | |
|---|---|
| ***H10K 59/127*** | (2023.01) |
| ***G09G 3/3233*** | (2016.01) |
| ***H10D 80/30*** | (2025.01) |
| ***H10K 59/131*** | (2023.01) |

(52) U.S. Cl.

CPC ....... *H10K 59/1275* (2023.02); *G09G 3/3233* (2013.01); *H10D 80/30* (2025.01); *H10K 59/131* (2023.02); *G09G 2300/0426* (2013.01); *G09G 2330/08* (2013.01)

(58) Field of Classification Search

CPC ............. G09G 2330/08; G09G 3/3233; H10K 59/1275; H10K 59/131; H10D 80/30; H10H 29/45; H10H 29/857; H10H 29/30–49; H10H 20/857; H01L 25/0753; H01L 33/62; H10W 90/00

See application file for complete search history.

(56) References Cited

U.S. PATENT DOCUMENTS

| | | | | |
|---|---|---|---|---|
| 8,729,552 | B2 | 5/2014 | Kim et al. | |
| 9,501,959 | B2 | 11/2016 | Kim et al. | |
| 2014/0151652 | A1 | 6/2014 | Im et al. | |
| 2021/0183833 | A1* | 6/2021 | Hu | H10H 20/857 |
| 2021/0398488 | A1 | 12/2021 | Park et al. | |
| 2023/0047907 | A1* | 2/2023 | Seto | H10K 59/1275 |

(Continued)

FOREIGN PATENT DOCUMENTS

| | | | |
|---|---|---|---|
| JP | 2008003290 | A * | 1/2008 |
| KR | 10-2008-0024009 | A | 3/2008 |

(Continued)

*Primary Examiner* — Lauren R Bell

(74) *Attorney, Agent, or Firm* — Innovation Counsel LLP

(57) ABSTRACT

A display apparatus, in which a defect in a pixel circuit is solved, comprises a first substrate including a first surface, a first pixel circuit arranged on the first surface of the first substrate, a second substrate arranged above the first pixel circuit and including a second surface facing the first surface and a third surface opposite the second surface, a first pad electrode arranged between the first surface of the first substrate and the second surface of the second substrate, a second pixel circuit arranged on the third surface of the second substrate and overlapping the first pixel circuit, a first through electrode passing through the second substrate and electrically connected to the second pixel circuit, and a second pad electrode arranged on the second surface of the second substrate, electrically connected to the first through electrode, and contacting the first pad electrode.

15 Claims, 11 Drawing Sheets

(56) References Cited

U.S. PATENT DOCUMENTS

2023/0389372 A1* 11/2023 Kawano .............. H10K 59/1275
2023/0389381 A1* 11/2023 Yanagawa .............. H04N 23/55

FOREIGN PATENT DOCUMENTS

KR 10-2014-0071806 A 6/2014
KR 10-1806405 B1 12/2017
KR 10-2105369 B1 4/2020
KR 10-2021-0157512 A 12/2021

* cited by examiner

DISPLAY APPARATUS

CROSS-REFERENCE TO RELATED APPLICATION

This application is based on and claims priority under 35 U.S.C. § 119 to Korean Patent Application No. 10-2022-0116641, filed on Sep. 15, 2022, in the Korean Intellectual Property Office, the disclosure of which is incorporated by reference herein in its entirety.

BACKGROUND

1. Field

The present disclosure generally relates to a display apparatus. More particularly, the present disclosure relates to a display apparatus capable of improving the yield of a display apparatus by solving a defect in a pixel circuit.

2. Description of the Related Art

A display apparatus visually displays data. The display apparatus is used as the display in a small product, such as a mobile phone, or as the display in a large product, such as a television.

Such a display apparatus includes a substrate partitioned into a display area and a non-display area, and a gate line and a data line are insulated from each other in the display area. A plurality of pixel regions are defined in the display area, and pixels arranged in each of the plurality of pixel regions receive electrical signals from the gate line and the data line crossing each other and emit light to display an image to the outside. A thin-film transistor and a pixel electrode electrically connected to the thin-film transistor are provided in each pixel region, and an opposite electrode is commonly provided in the pixel regions. Various lines configured to transmit electrical signals to pixels in the display area, a gate driver, a data driver, and pads to which a controller may be connected may be provided in the non-display area.

Recently, display apparatuses have been used in a greater variety of ways. In addition, display apparatuses have become thinner and lighter in weight, and thus, their range of use has widened. As display apparatuses are used in various ways, various methods may be used to design forms of display apparatuses, and the number of functions that may be connected or linked to display apparatuses has been increasing.

SUMMARY

To solve various problems, one or more embodiments include a display apparatus in which a defect in a pixel circuit is solved. However, such a technical problem is an example, and one or more embodiments are not limited thereto.

Additional aspects will be set forth in part in the description which follows and, in part, will be apparent from the description, or may be learned by practice of the presented embodiments of the disclosure.

According to one or more embodiments, a display apparatus includes a first substrate including a first surface, a first pixel circuit arranged on the first surface of the first substrate, a second substrate arranged on the first pixel circuit and including a second surface facing the first surface and a third surface opposite the second surface, a first pad electrode arranged between the first surface of the first substrate and the second surface of the second substrate, a second pixel circuit arranged on the third surface of the second substrate and overlapping the first pixel circuit, a first through electrode passing through the second substrate and electrically connected to the second pixel circuit, and a second pad electrode arranged on the second surface of the second substrate, electrically connected to the first through electrode, and contacting the first pad electrode.

The display apparatus may further include a third pixel circuit arranged on the first surface of the first substrate, a first display element electrically connected to the third pixel circuit, and a second display element electrically connected to the second pixel circuit.

The display apparatus may further include a first connection electrode connecting the first display element to the third pixel circuit, and a second connection electrode connecting the second display element to the second pixel circuit, wherein a first length of the first connection electrode in a thickness direction of the first substrate may be greater than a second length of the second connection electrode in the thickness direction of the first substrate.

The display apparatus may further include a third pad electrode electrically connected to the third pixel circuit, and an insulating layer covering top and side surfaces of the third pad electrode, side surfaces of the first pad electrode, and side surfaces of the second pad electrode.

The display apparatus may further include a first conductive line extending in a first direction and electrically connected to the first pad electrode.

The first conductive line and the first pad electrode may be arranged on the same layer or the first conductive line and the first pad electrode may be integrally formed with each other. The first pad electrode may be arranged on the first conductive line.

The display apparatus may further include a third pad electrode arranged between the first surface of the first substrate and the second surface of the second substrate, a second through electrode passing through the second substrate and electrically connected to the second pixel circuit, a fourth pad electrode arranged on the second surface of the second substrate, electrically connected to the second through electrode, and contacting the third pad electrode, and a second conductive line extending in a second direction crossing the first direction and electrically connected to the third pad electrode.

The second pixel circuit may include a driving transistor, a scan transistor configured to transmit a data voltage to the driving transistor in response to a scan signal, and a storage capacitor including a first electrode connected to a gate of the driving transistor and a second electrode to which a driving voltage is applied, wherein the first conductive line may transmit one of the data voltage and the driving voltage to the first pad electrode, and wherein the second conductive line may transmit the scan signal to the third pad electrode.

The display apparatus may further include a fifth pad electrode arranged between the first surface of the first substrate and the second surface of the second substrate, a third through electrode passing through the second substrate and electrically connected to the second pixel circuit, a sixth pad electrode arranged on the second surface of the second substrate, electrically connected to the third through electrode, and contacting the fifth pad electrode, and a third conductive line extending in the first direction and configured to transmit another of the data voltage and the driving voltage to the fifth pad electrode.

The second pixel circuit may include a semiconductor layer, a gate electrode arranged on the semiconductor layer and at least partially overlapping the semiconductor layer, and a bridge electrode arranged on the gate electrode and electrically connected to the semiconductor layer, wherein the first through electrode may directly contact the bridge electrode.

The display apparatus may further include a gate line arranged on the third surface of the second substrate, wherein the second pixel circuit may include a semiconductor layer, wherein the gate line may at least partially overlap the semiconductor layer from on the semiconductor layer, and wherein the first through electrode may directly contact the gate line.

A planar area of the first substrate may be greater than a planar area of the second substrate.

The first pixel circuit may be electrically connected to the first pad electrode.

The first pixel circuit may be electrically insulated from the first pad electrode.

According to one or more embodiments, a display apparatus includes a first substrate in which a display area and a peripheral area around the display area are defined, a first conductive line arranged in the display area and extending in a first direction, a plurality of first pad electrodes arranged in the first direction in the display area and electrically connected to the first conductive line, a second conductive line arranged in the display area and extending in a second direction crossing the first direction, and a plurality of second pad electrodes arranged in the second direction in the display area and electrically connected to the second conductive line, wherein the first conductive line and the plurality of first pad electrodes are arranged on the same layer, and wherein the second conductive line and the plurality of second pad electrodes are arranged on different layers.

The first conductive line and the plurality of first pad electrodes may be integrally formed with each other, and the plurality of second pad electrodes may be arranged on the second conductive line.

The display apparatus may further include a pixel circuit electrically connected to the first conductive line and the second conductive line, wherein the pixel circuit may include a driving transistor, a scan transistor configured to transmit a data voltage to the driving transistor in response to a scan signal, and a storage capacitor including a first electrode connected to a gate of the driving transistor and a second electrode to which a driving voltage is applied, wherein the first conductive line may be configured to transmit one of the data voltage and the driving voltage to the pixel circuit, and wherein the second conductive line may be configured to transmit the scan signal to the pixel circuit.

The display apparatus may further include a second substrate arranged on the plurality of first pad electrodes and the plurality of second pad electrodes and including a first surface facing the first substrate and a second surface opposite the first surface, a first pixel circuit arranged on the second surface of the second substrate, a first through electrode passing through the second substrate and electrically connected to the first pixel circuit, a third pad electrode arranged on the first surface of the second substrate, electrically connected to the first through electrode, and contacting one of the plurality of first pad electrodes, a second through electrode passing through the second substrate and electrically connected to the first pixel circuit, and a fourth pad electrode arranged on the first surface of the second substrate, electrically connected to the second through electrode, and contacting one of the plurality of second pad electrodes.

The display apparatus may further include a second pixel circuit arranged between the first substrate and the second substrate and electrically insulated from the first conductive line and the second conductive line, wherein the first pixel circuit and the second pixel circuit may overlap each other in a thickness direction of the first substrate, wherein a planar area of the first substrate may be greater than a planar area of the second substrate.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
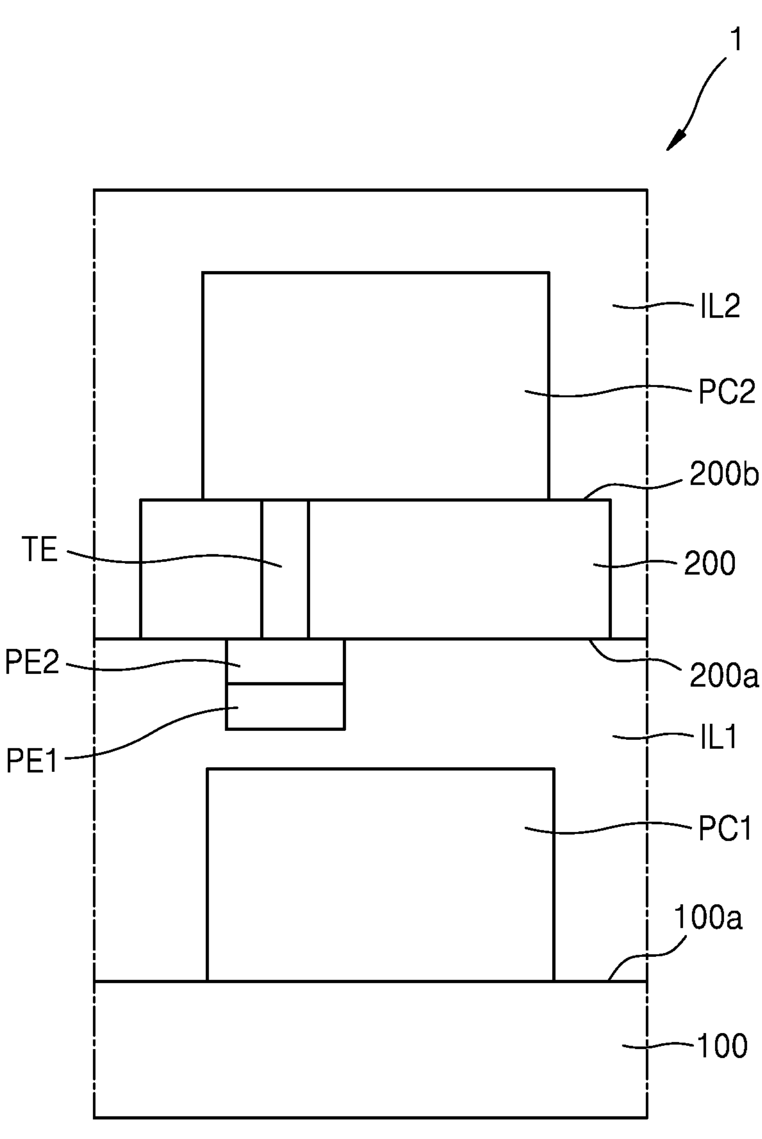
FIG. 1 is a schematic cross-sectional view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

One or more embodiments will be described below in more detail with reference to the accompanying drawings. Those elements that are the same or are in correspondence with each other are rendered the same reference numeral regardless of the figure number, and redundant descriptions thereof are omitted.

While such terms as “first” and “second” may be used to describe various elements, such elements must not be limited to the above terms. The above terms are used only to distinguish one element from another.

The singular forms “a,” “an,” and “the” as used herein are intended to include the plural forms as well unless the context clearly indicates otherwise.

It will be understood that the terms “include,” “comprise,” and “have” as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

As used herein, the expression “A and/or B” refers to A, B, or A and B. In addition, the expression “at least one of A and B” refers to A, B, or A and B.

It will be further understood that, when layers, regions, or elements are referred to as being connected to each other, they may be directly connected to each other and/or may be indirectly connected to each other with intervening layers, regions, or elements therebetween. For example, when layers, regions, or elements are referred to as being electrically connected to each other, they may be directly electrically connected to each other and/or may be indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic cross-sectional view of a display apparatus 1 according to an embodiment.

Referring to FIG. 1, the display apparatus 1 may include a first substrate 100, a second substrate 200, a first pixel circuit PC1, a second pixel circuit PC2, a first insulating layer IL1, a second insulating layer IL2, a through electrode TE, a first pad electrode PE1, and a second pad electrode PE2.

The first substrate 100 may have a first surface 100*a*. The second substrate 200 may be disposed above the first surface 100*a* of the first substrate 100. The second substrate 200 may have a second surface 200*a* facing the first surface 100*a* of the first substrate 100 and a third surface 200*b* opposite the second surface 200*a*. The first substrate 100 and the second substrate 200 may include an insulating material, such as glass, quartz, or polymer resin. The first substrate 100 and the second substrate 200 may be a rigid substrate or a flexible substrate that may be bent, folded, or rolled.

In an embodiment, a planar area of the first substrate 100 may be greater than a planar area of the second substrate 200.

Figure 4:
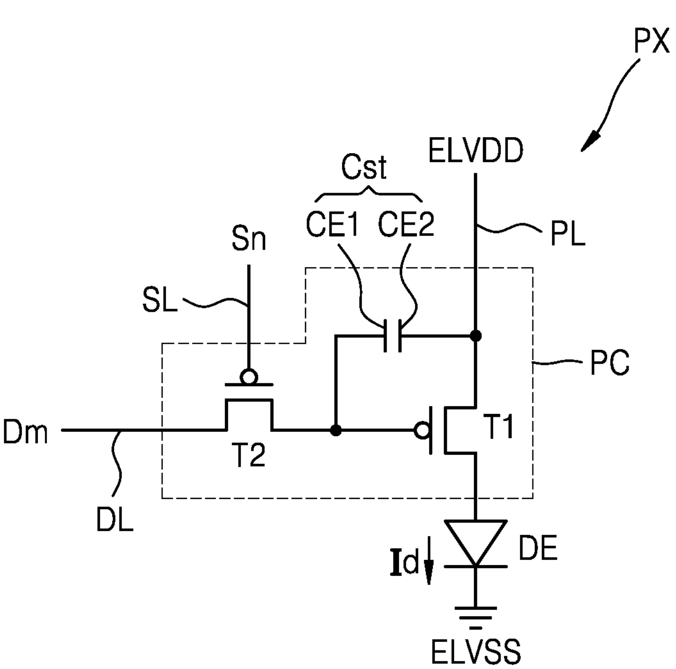
FIG. 4 is an equivalent circuit diagram schematically showing a pixel applicable to a display apparatus according to an embodiment.

The first pixel circuit PC1 may be disposed on the first surface 100*a* of the first substrate 100. The first pixel circuit PC1 may be disposed between the first surface 100*a* of the first substrate 100 and the second surface 200*a* of the second substrate 200. The second pixel circuit PC2 may be disposed on the third surface 200*b* of the second substrate 200. The second pixel circuit PC2 may overlap the first pixel circuit PC1. As shown in FIG. 4 described below, the first pixel circuit PC1 and the second pixel circuit PC2 may include at least one transistor and a storage capacitor.

The first insulating layer IL1 may be disposed over the first pixel circuit PC1. The second insulating layer IL2 may be disposed over the second pixel circuit PC2. That is, the first insulating layer IL1 surrounds the first pixel circuit PC1, and the second insulating layer IL2 surrounds the second pixel circuit PC2. The first insulating layer IL1 and the second insulating layer IL2 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). As another example, the first insulating layer IL1 and the second insulating layer IL2 may include an organic material. For example, the first insulating layer IL1 and the second insulating layer IL2 may include a general commercial polymer, such as benzocyclobutene (BCB), polyimide, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

Although FIG. 1 shows the first insulating layer IL1 disposed over the first pixel circuit PC1 and the second insulating layer IL2 disposed over the second pixel circuit PC2, in another embodiment, the first insulating layer IL1 may be arranged in the first pixel circuit PC1, and the second insulating layer IL2 may be arranged in the second pixel circuit PC2.

The through electrode TE may pass through the second substrate 200 and be electrically connected to the second pixel circuit PC2. The through electrode TE may include a conductive material including molybdenum (Mo), aluminum (Al), copper (Cu), titanium (Ti), etc., and may have a multi-layer or single-layer structure including the above-described material. As an example, the through electrode TE may have a multi-layer structure of Ti/Al/Ti.

The first pad electrode PE1 may be disposed between the first surface 100*a* of the first substrate 100 and the second surface 200*a* of the second substrate 200. The second pad electrode PE2 may be disposed on the second surface 200*a* of the second substrate 200. The second pad electrode PE2 may (directly) contact the first pad electrode PE1. The second pad electrode PE2 may be electrically connected to the through electrode TE. The second pad electrode PE2 may be connected to the second pixel circuit PC2 through the through electrode TE. The first pad electrode PE1 and the second pad electrode PE2 may include a conductive material including molybdenum (Mo), aluminum (Al), copper (Cu), titanium (Ti), etc., and may have a multi-layer or single-layer structure including the above-described material. As an example, the first pad electrode PE1 and the second pad electrode PE2 may have a multi-layer structure of Ti/Al/Ti.

The through electrode TE and the second pad electrode PE2 may be integrally formed with each other. At least a portion of the second pad electrode PE2 may be buried in a hole formed in the second substrate 200, and at least a portion of the second pad electrode PE2 buried in the hole may be referred to as the through electrode TE.

In an embodiment, the first pixel circuit PC1 may be electrically connected to the first pad electrode PE1.

In another embodiment, the first pixel circuit PC1 may be electrically insulated from the first pad electrode PE1.

The first pixel circuit PC1 may be defective. The second pixel circuit PC2 may be a circuit configured to drive a display element in place of the first pixel circuit PC1 when the first pixel circuit PC1 is defective. The second pixel circuit PC2 may be disposed (or transplanted) over the defective first pixel circuit PC1. Thus, yield of the display apparatus 1 may be prevented from decreasing due to a defect in the first pixel circuit PC1.

Figure 2:
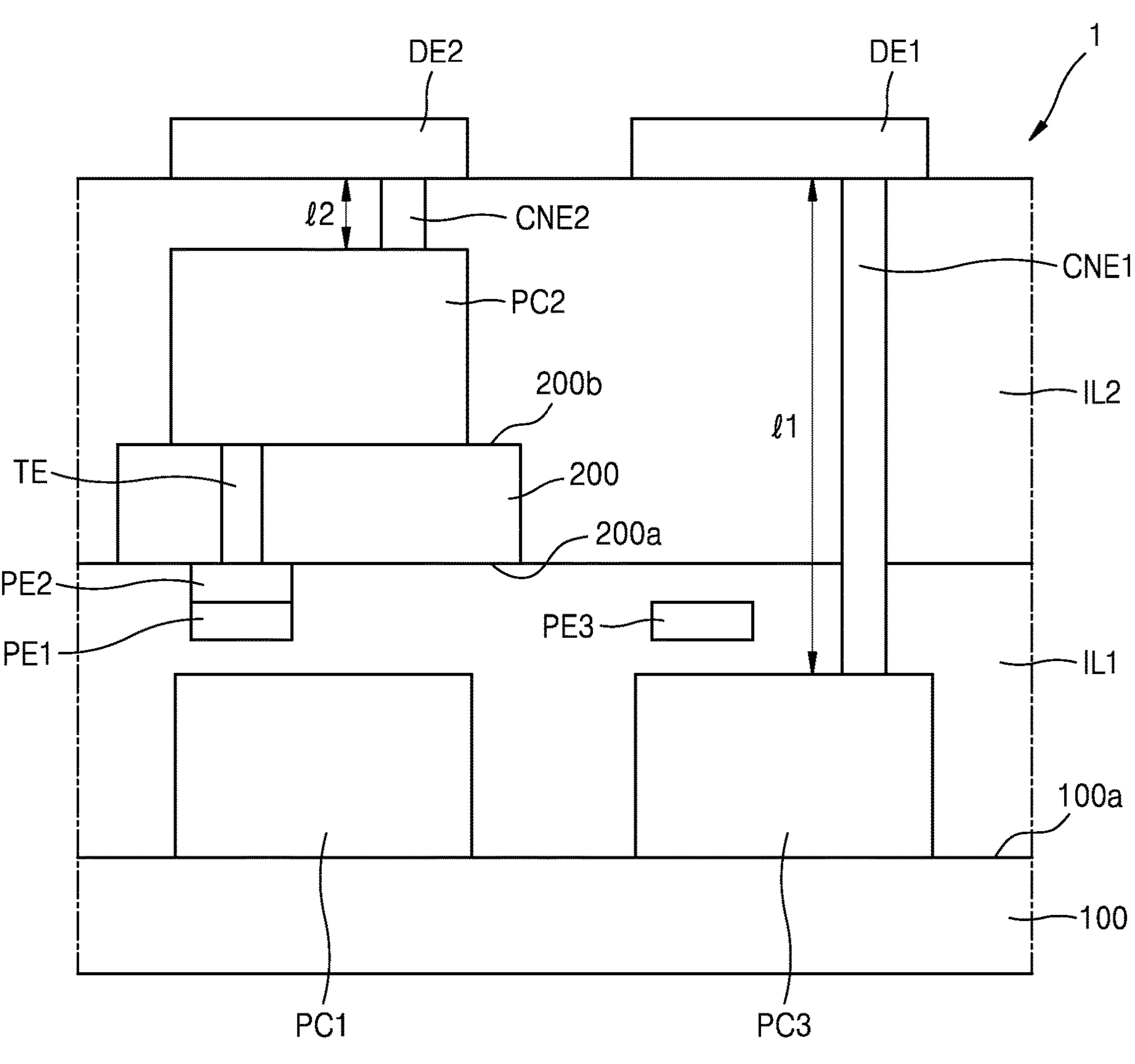
FIG. 2 is a schematic cross-sectional view of a display apparatus according to an embodiment.

FIG. 2 is a schematic cross-sectional view of a display apparatus 1 according to an embodiment. In FIG. 2, elements that are the same as those in FIG. 1 are designated by the same reference numerals, and thus, a repeated description thereof is omitted.

Referring to FIG. 2, the display apparatus 1 may include a third pixel circuit PC3, a third pad electrode PE3, a first display element DE1, a second display element DE2, a first connection electrode CNE1, and a second connection electrode CNE2.

The third pixel circuit PC3 may be disposed on the first surface 100*a* of the first substrate 100. The third pixel circuit PC3 may be arranged on the same layer as the first pixel circuit PC1. As shown in FIG. 4 described below, the third pixel circuit PC3 may include at least one transistor and a storage capacitor.

The third pad electrode PE3 may be disposed between the first surface 100*a* of the first substrate 100 and the second surface 200*a* of the second substrate 200. The third pad electrode PE3 may be arranged on the same layer as the first pad electrode PE1. The third pad electrode PE3 may be electrically connected to the third pixel circuit PC3. The third pad electrode PE3 may include a conductive material including molybdenum (Mo), aluminum (Al), copper (Cu), titanium (Ti), etc., and may have a multi-layer or single-layer structure including the above-described material. As an example, the third pad electrode PE3 may have a multi-layer structure of Ti/Al/Ti.

The first insulating layer IL1 may cover side surfaces of the first pad electrode PE1, side surfaces of the second pad electrode PE2, and top and side surfaces of the third pad electrode PE3.

The first display element DE1 may be electrically connected to the third pixel circuit PC3, and the second display element DE2 may be electrically connected to the second pixel circuit PC2. Each of the first display element DE1 and the second display element DE2 may include an emission layer, and the emission layer may include an organic material. The first display element DE1 and the second display element DE2 may be organic light-emitting diodes (OLEDs).

The first connection electrode CNE1 may connect the first display element DE1 to the third pixel circuit PC3. The first connection electrode CNE1 may pass through the first insulating layer IL1 and the second insulating layer IL2. The second connection electrode CNE2 may connect the second display element DE2 to the second pixel circuit PC2. The second connection electrode CNE2 may pass through the second insulating layer IL2. The first connection electrode CNE1 and the second connection electrode CNE2 may include a conductive material including molybdenum (Mo), aluminum (Al), copper (Cu), titanium (Ti), etc., and may have a multi-layer or single-layer structure including the above-described material. As an example, the first connection electrode CNE1 and the second connection electrode CNE2 may have a multi-layer structure of Ti/Al/Ti. The first connection electrode CNE1 and the second connection electrode CNE2 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semitransparent electrode layer on the reflective layer. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO).

In an embodiment, a first length $\ell 1$ of the first connection electrode CNE1 in a thickness direction of the first substrate 100 may be greater than a second length $\ell 2$ of the second connection electrode CNE2 in the thickness direction of the first substrate 100.

Figure 3:
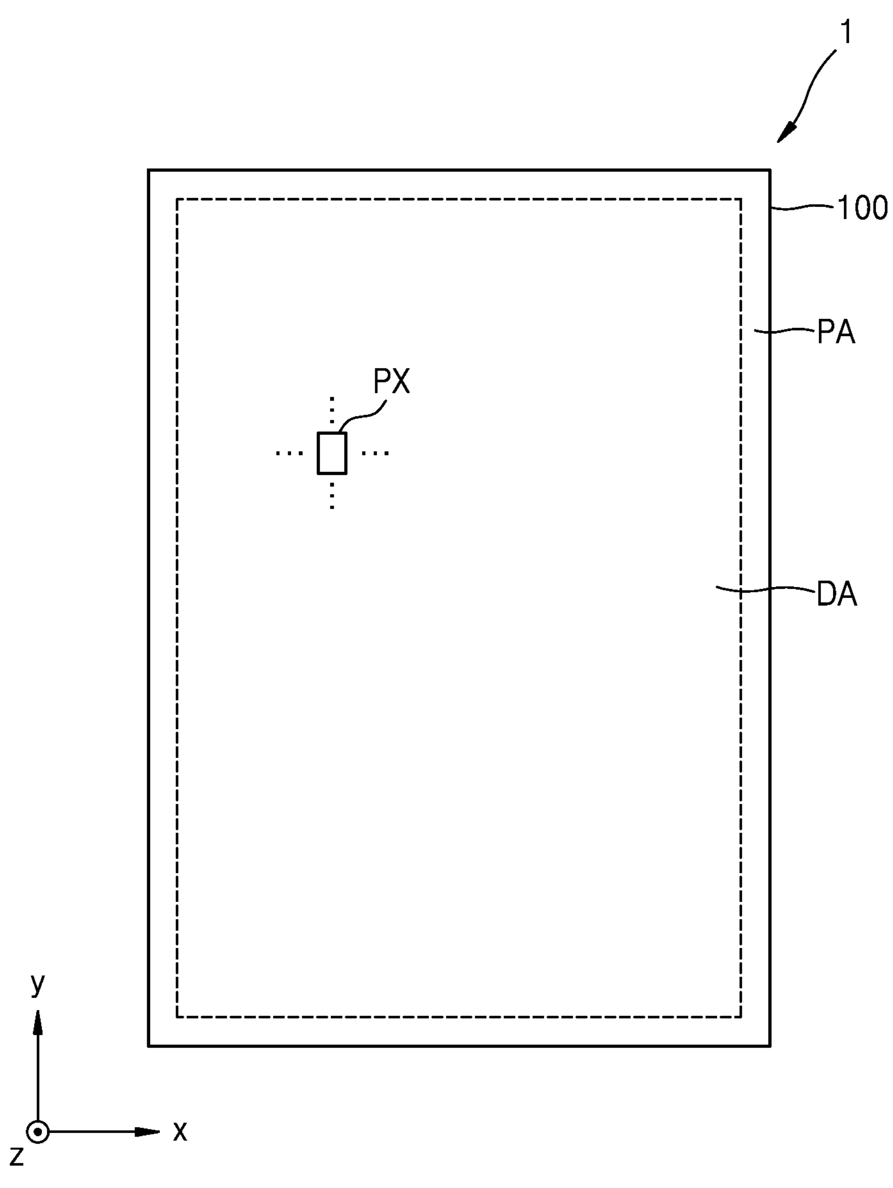
FIG. 3 is a schematic plan view of a display apparatus according to an embodiment.

FIG. 3 is a schematic plan view of the display apparatus 1 according to an embodiment.

Referring to FIG. 3, the display apparatus 1 includes a display area DA displaying an image and a peripheral area PA surrounding at least a portion of the display area DA. The display apparatus 1 may provide an image to the outside by using light emitted from the display area DA. Because the display apparatus 1 includes the first substrate 100, it may also be said that the first substrate 100 has the display area DA and the peripheral area PA. In other words, the display area DA and the peripheral area PA may be defined in the first substrate 100.

The first substrate 100 may include various materials, such as glass, metal, or plastic. According to an embodiment, the first substrate 100 may include a flexible material. In this regard, the flexible material refers to a material that may be bent, folded, and/or rolled (e.g., with relative ease). The first substrate 100 including a flexible material may include ultra-thin glass, metal, or plastic.

As shown in FIG. 3, the display area DA may have a rectangular shape. In another embodiment, the display area DA may have a polygonal shape, such as a triangle, a pentagon, or a hexagon, a circular shape, an oval shape, or an atypical shape.

Pixels PX including various display elements, such as an OLED, may be arranged in the display area DA of the first substrate 100. A pixel PX may include a plurality of pixels PX, and the plurality of pixels PX may be arranged in various forms, such as a stripe arrangement, a PenTile arrangement, and a mosaic arrangement, to display an image. Hereinafter, in the present description, each pixel PX refers to a sub-pixel emitting light of a different color, and each pixel PX may be, for example, one of a red sub-pixel, a green sub-pixel, and a blue sub-pixel.

Although an organic light-emitting display is described as an example of a display apparatus according to an embodiment, a display apparatus described herein is not limited thereto. In another embodiment, the display apparatus described herein may be a display apparatus, such as an inorganic light-emitting display (or an inorganic electroluminescent (EL) display) or a quantum dot light-emitting display. For example, an emission layer of a display element provided in the display apparatus may include an organic material, an inorganic material, quantum dots, an organic material and quantum dots, an inorganic material and quantum dots, or an organic material, an inorganic material, and quantum dots.

The peripheral area PA of the first substrate 100 is an area arranged around the display area DA, and may be an area in which no image is displayed. Various lines configured to transmit electrical signals to be applied to the display area DA and pads to which a printed circuit board or a driver integrated circuit (IC) chip is attached may be arranged in the peripheral area PA.

FIG. 4 is an equivalent circuit diagram schematically showing the pixel PX applicable to a display apparatus according to an embodiment.

Referring to FIG. 4, the pixel PX may include a pixel circuit PC connected to a scan line SL and a data line DL, and a display element DE connected to the pixel circuit PC. A cathode of the display element DE may be a common electrode to which a second driving voltage ELVSS is applied. The pixel circuit PC of FIG. 4 may correspond to the first to third pixel circuits PC1, PC2, and PC3 of FIGS. 1 and 2, and the display element DE of FIG. 4 may correspond to the first and second display elements DE1 and DE2 of FIG. 2.

The pixel circuit PC may include a first transistor T1, a second transistor T2, and a storage capacitor Cst.

The first transistor T1 may be a driving transistor in which the volume of a drain current is determined according to a gate-source voltage, and the second transistor T2 may be a switching transistor that is turned on/off according to a gate-source voltage, substantially, a gate voltage. The first transistor T1 and the second transistor T2 may be thin-film transistors.

The first transistor T1 may be referred to as a driving transistor, and the second transistor T2 may be referred to as a scan transistor.

The storage capacitor Cst is connected between a power line PL and a gate of the driving transistor T1. The storage capacitor Cst may have a second electrode CE2 connected to the power line PL, and a first electrode CE1 connected to the gate of the driving transistor T1. The storage capacitor Cst may store a voltage corresponding to a difference between a voltage received from the scan transistor T2 and a first driving voltage ELVDD supplied to the power line PL.

The driving transistor T1 may be configured to control the volume of a driving current Id flowing from the power line PL to the display element DE according to a gate-source voltage. The display element DE may emit light having certain brightness according to the driving current Id. The driving transistor T1 may have a gate connected to the first electrode CE1 of the storage capacitor Cst, a source connected to the power line PL, and a drain connected to the display element DE.

The scan transistor T2 may be configured to transmit a data voltage Dm to the gate of the driving transistor T1 in response to a scan signal Sn. The scan transistor T2 may have a gate connected to the scan line SL, a source connected to the data line DL, and a drain connected to the gate of the driving transistor T1.

Although FIG. 4 shows a case in which the pixel circuit PC includes two transistors and one storage capacitor, one or more embodiments are not limited thereto. For example, the pixel circuit PC may include three or more transistors and/or two or more storage capacitors. In an embodiment, the pixel circuit PC may include seven transistors and one storage capacitor.

Although FIG. 4 shows the first transistor T1 and the second transistor T2 as p-type metal-oxide-semiconductor field-effect transistors (MOSFETs), in another embodiment, at least one of the first transistor T1 and the second transistor T2 may be an n-type MOSFET. For example, the first transistor T1 and the second transistor T2 may be n-type MOSFETs.

Figure 5:
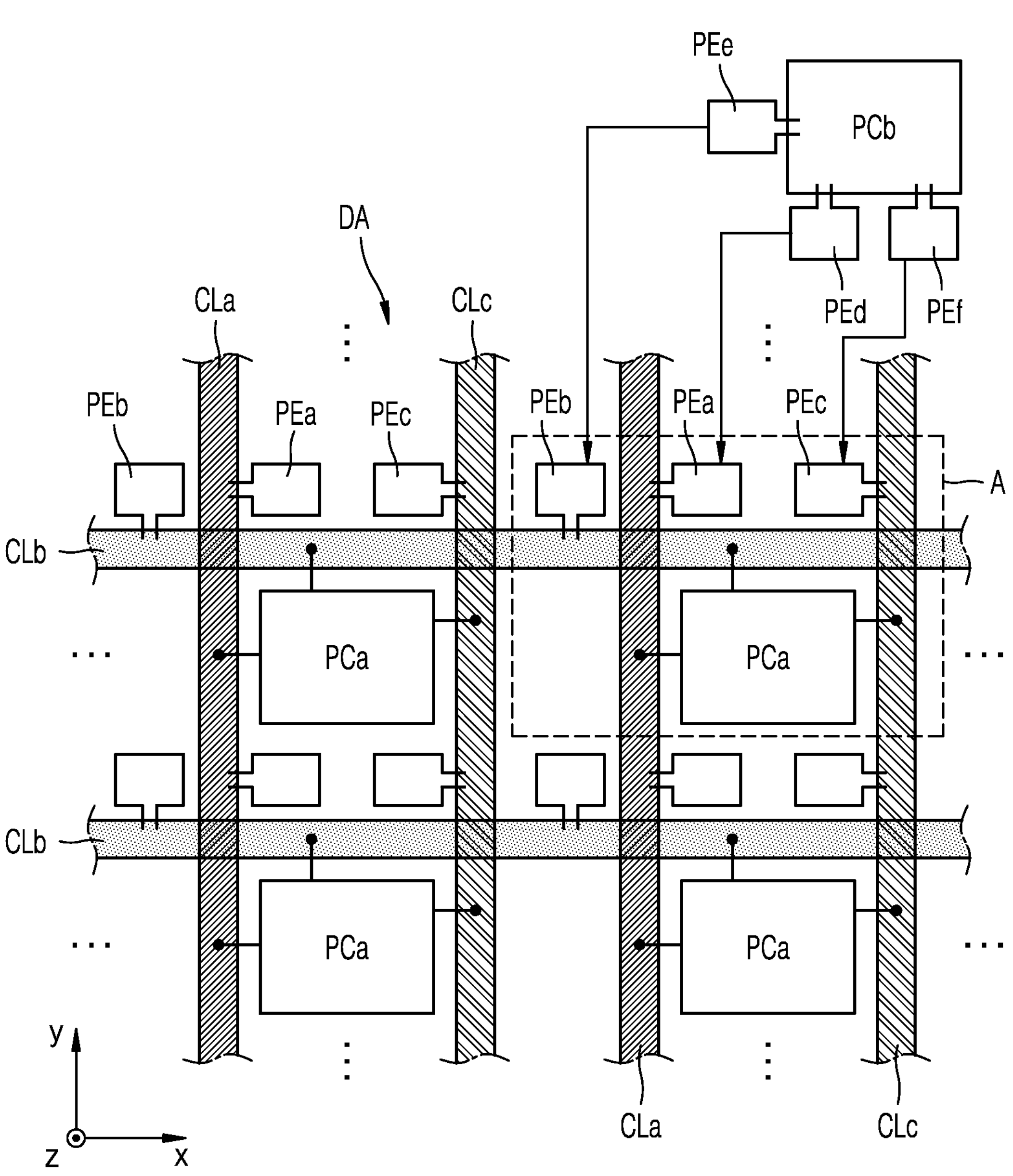
FIG. 5 is an enlarged plan view schematically showing a portion of a display apparatus according to an embodiment.

FIG. 5 is an enlarged plan view schematically showing a portion of a display apparatus according to an embodiment.

Referring to FIG. 5, first pixel circuits PCa, first conductive lines CLa, second conductive lines CLb, third conductive lines CLc, first pad electrodes PEa, second pad electrodes PEb, third pad electrodes PEc, at least one second pixel circuit PCb, at least one fourth pad electrode PEd, at least one fifth pad electrode PEe, and at least one sixth pad electrode PEf may be arranged in the display area DA of the display apparatus 1 (refer to FIG. 3).

The first pixel circuits PCa may be arranged in a first direction (e.g., direction ±y) and a second direction (e.g., direction ±x). As shown in FIG. 4 described above, the first pixel circuits PCa may include at least one transistor and a storage capacitor.

The first conductive lines CLa may be arranged in the second direction (e.g., direction ±x). Each of the first conductive lines CLa may extend in the first direction (e.g., direction ±y) and be configured to transmit an electrical signal to the first pixel circuits PCa arranged in the same column. For example, a first conductive line CLa may be configured to transmit the data voltage Dm of FIG. 4 described above to the first pixel circuits PCa arranged in the same column. The first conductive line CLa may correspond to the data line DL of FIG. 4 described above.

The second conductive lines CLb may be arranged in the first direction (e.g., direction ±y). Each of the second conductive lines CLb may extend in the second direction (e.g., direction ±x) and be configured to transmit an electrical signal to the first pixel circuits PCa arranged in the same row. For example, a second conductive line CLb may be configured to transmit the scan signal Sn of FIG. 4 described above to the first pixel circuits PCa arranged in the same row. The second conductive line CLb may correspond to the scan line SL of FIG. 4 described above.

The third conductive lines CLc may be arranged in the second direction (e.g., direction ±x). Each of the third conductive lines CLc may extend in the first direction (e.g., direction ±y) and be configured to transmit an electrical signal to the first pixel circuits PCa arranged in the same column. For example, a third conductive line CLc may be configured to transmit the first driving voltage ELVDD of FIG. 4 described above to the first pixel circuits PCa arranged in the same column. The third conductive line CLc may correspond to the power line PL of FIG. 4 described above.

In an embodiment, the first conductive lines CLa and the third conductive lines CLc may be alternately arranged in the second direction (e.g., direction ±x).

The first pad electrodes PEa may be arranged in the first direction (e.g., direction ±y) of the first conductive line CLa and electrically connected to the first conductive line CLa. The second pad electrodes PEb may be arranged in the second direction (e.g., direction ±x) of the second conductive line CLb and electrically connected to the second conductive line CLb. The third pad electrodes PEc may be arranged in the first direction (e.g., direction ±y) of the third conductive line CLc and electrically connected to the third conductive line CLc.

Figure 6:
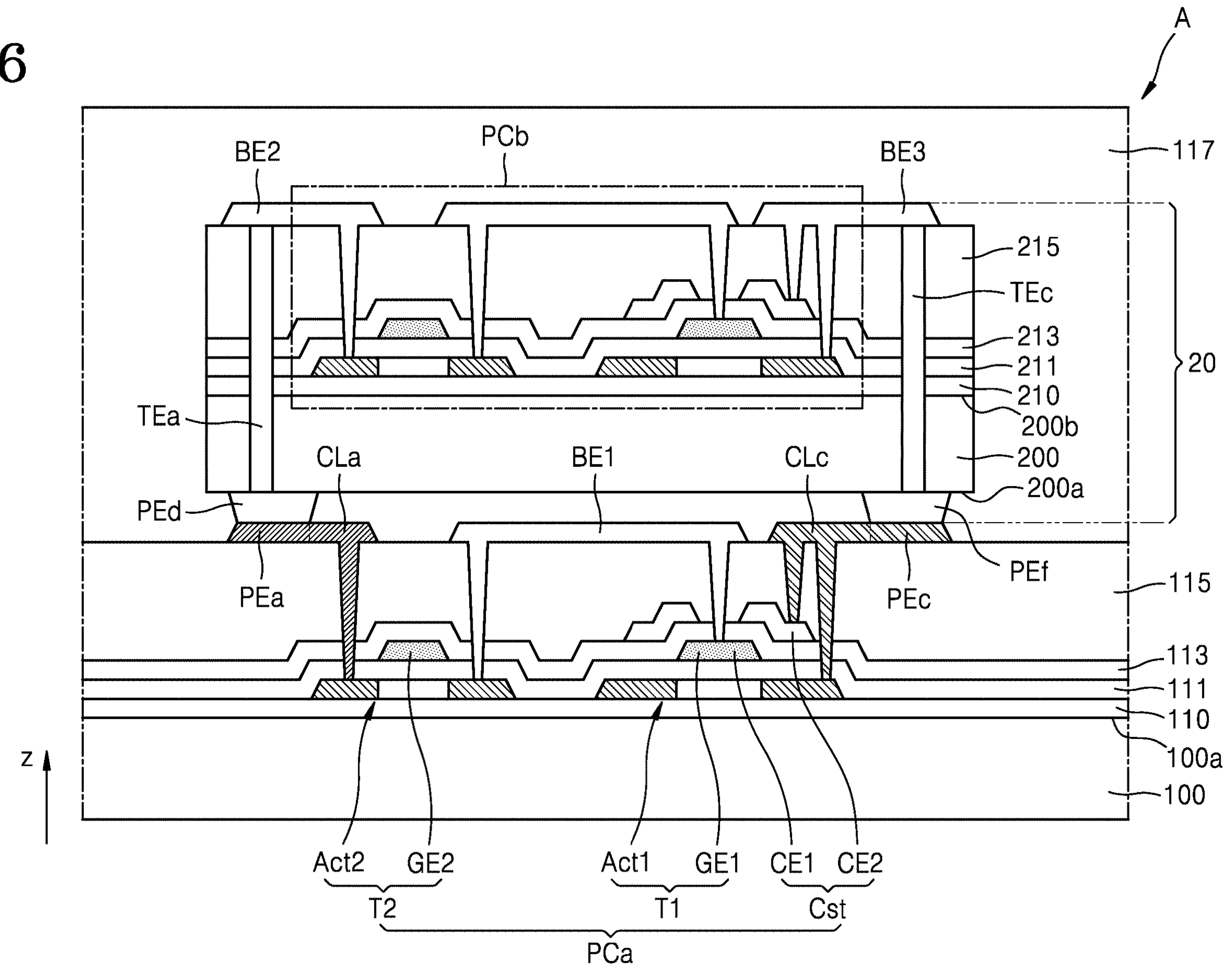
FIG. 6 is a schematic cross-sectional view of a display apparatus according to an embodiment.

In an embodiment, as shown in FIG. 6 described below, the first conductive line CLa and the first pad electrodes PEa may be arranged on the same layer. The first conductive line CLa and the first pad electrodes PEa may be integrally formed with each other. The third conductive line CLc and the third pad electrodes PEc may be arranged on the same layer. The third conductive line CLc and the third pad electrodes PEc may be integrally formed with each other.

Figure 7:
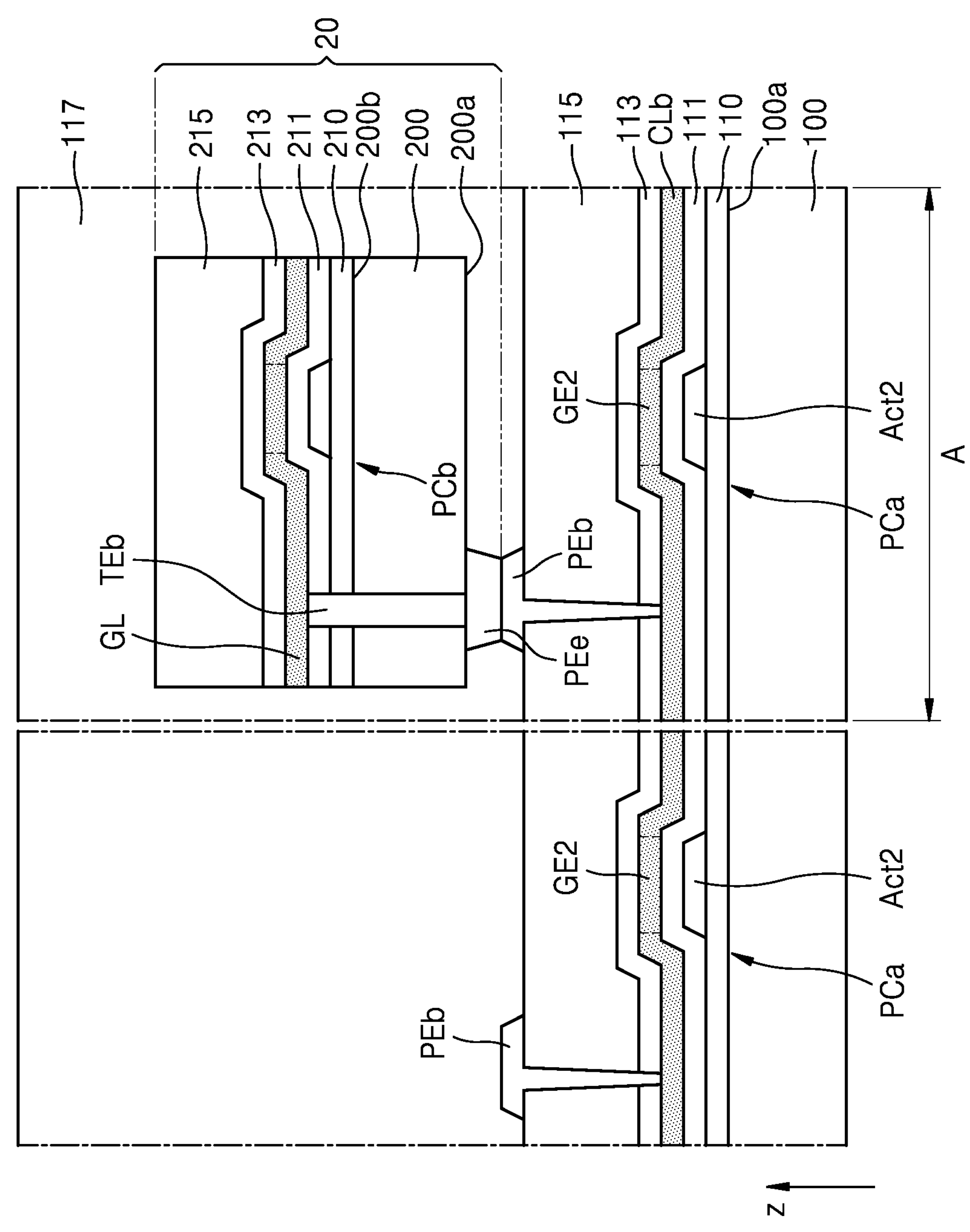
FIG. 7 is a schematic cross-sectional view of a display apparatus according to an embodiment.

In an embodiment, as shown in FIG. 7 described below, the second conductive line CLb and the second pad electrodes PEb may be arranged on different layers. For example, the second pad electrodes PEb may be disposed above the second conductive line CLb.

The at least one second pixel circuit PCb may be electrically connected to the fourth pad electrode PEd, the fifth pad electrode PEe, and the sixth pad electrode PEf. The fourth pad electrode PEd may contact one of the first pad electrodes PEa (also shown in FIG. 6), the fifth pad electrode PEe may contact one of the second pad electrodes PEb (also shown in FIG. 7), and the sixth pad electrode PEf may contact one of the third pad electrodes PEc (also shown in FIG. 6). For example, as shown in FIG. 5, the fourth pad electrode PEd, the fifth pad electrode PEe, and the sixth pad electrode PEF may contact a first pad electrode PEa, a second pad electrode PEb, and a third pad electrode PEc arranged in region A, respectively. The second pixel circuit PCb may be connected to the first conductive line CLa through the first pad electrode PEa and the fourth pad electrode PEd and may receive the data voltage Dm from the first conductive line CLa. The second pixel circuit PCb may be connected to the second conductive line CLb through the second pad electrode PEb and the fifth pad electrode PEe and may receive the scan signal Sn from the second conductive line CLb. The second pixel circuit PCb may be connected to the third conductive line CLc through the third pad electrode PEc and the sixth pad electrode PEf and may receive the first driving voltage ELVDD from the third conductive line CLc.

To show that the second pixel circuit PCb is connected to conductive lines through pad electrodes, the second pixel circuit PCb is illustrated in FIG. 5 as being apart from a first pixel circuit PCa arranged in region A. However, the second pixel circuit PCb may overlap the first pixel circuit PCa arranged in region A. For example, as shown in FIG. 6 described below, the second pixel circuit PCb may be disposed above the first pixel circuit PCa arranged in region A and may overlap the same.

The first pixel circuit PCa arranged in region A may be defective. The second pixel circuit PCb may be a circuit configured to drive a display element in place of the defective first pixel circuit PCa. The second pixel circuit PCb may be disposed (or transplanted) over the defective first pixel circuit PCa. Thus, reduction in yield of the display apparatus 1 due to a defect in at least one of the first pixel circuits PCa may be prevented.

Although FIG. 5 shows that the first pixel circuit PCa arranged in region A is electrically connected to the first conductive line CLa, the second conductive line CLb, and the third conductive line CLc and thus electrically connected to the first pad electrode PEa, the second pad electrode PEb, and the third pad electrode PEc, in another embodiment, the first pixel circuit PCa arranged in region A may be electrically insulated from the first pad electrode PEa, the second pad electrode PEb, and the third pad electrode PEc. The first pixel circuit PCa arranged in region A may be electrically insulated from the first conductive line CLa, the second conductive line CLb, and the third conductive line CLc.

FIG. 6 is a schematic cross-sectional view of a display apparatus according to an embodiment. Specifically, FIG. 6 is a schematic cross-sectional view of region A of FIG. 5.

Referring to FIG. 6, the first pixel circuit PCa may be disposed on the first surface 100*a* of the first substrate 100. The first pixel circuit PCa may include the first transistor T1, the second transistor T2, and the storage capacitor Cst. The first transistor T1 may include a first semiconductor layer Act1 and a first gate electrode GE1 at least partially overlapping the first semiconductor layer Act1. The second transistor T2 may include a second semiconductor layer Act2 and a second gate electrode GE2 at least partially overlapping the second semiconductor layer Act2. The storage capacitor Cst may include the first electrode CE1 and the second electrode CE2. The first gate electrode GE1 of the first transistor T1 may be connected to the second semiconductor layer Act2 of the second transistor T2 through a first bridge electrode BE1. The description of the first pixel circuit PCa may apply to the second pixel circuit PCb described below in the same way.

An auxiliary panel 20 may be disposed over the first pixel circuit PCa. The auxiliary panel 20 may include the second pixel circuit PCb, the fourth pad electrode PEd, the sixth pad electrode PEf, a first through electrode TEa, a third through electrode TEc, a second bridge electrode BE2, and a third bridge electrode BE3. The fourth pad electrode PEd and the sixth pad electrode PEf may be disposed on the second surface 200*a* of the second substrate 200. The second pixel circuit PCb, the second bridge electrode BE2, and the third bridge electrode BE3 may be disposed on the third surface 200*b* of the second substrate 200. The second bridge electrode BE2 and the third bridge electrode BE3 may be connected to the second pixel circuit PCb. The second bridge electrode BE2 may be connected to the fourth pad electrode PEd through the first through electrode TEa passing through the second substrate 200. The first through electrode TEa may directly contact the second bridge electrode BE2. The third bridge electrode BE3 may be connected to the sixth pad electrode PEf through the third through electrode TEc passing through the second substrate 200. The third through electrode TEc may directly contact the third bridge electrode BE3.

In an embodiment, the first through electrode TEa and the fourth pad electrode PEd may be integrally formed with each other. At least a portion of the fourth pad electrode PEd may be buried in a hole formed in the second substrate 200, and at least a portion of the fourth pad electrode PEd buried in the hole may be referred to as the first through electrode TEa. Although the descriptions are given based on the first through electrode TEa and the fourth pad electrode PEd, the same may apply to the third through electrode TEc and the sixth pad electrode PEf.

The first conductive line CLa, the third conductive line CLc, the first pad electrode PEa, and the third pad electrode PEc may be disposed between the first surface 100*a* of the first substrate 100 and the auxiliary panel 20. The first conductive line CLa and the third conductive line CLc may be connected to the first pixel circuit PCa. The first conductive line CLa and the first pad electrode PEa may be integrally formed with each other, and the third conductive line CLc and the third pad electrode PEc may be integrally formed with each other. The first pad electrode PEa may directly contact the fourth pad electrode PEd of the auxiliary panel 20, and the third pad electrode PEc may directly contact the sixth pad electrode PEf of the auxiliary panel 20.

In an embodiment, a planar area of the first substrate 100 may be greater than a planar area of the second substrate 200 of the auxiliary panel 20.

Hereinafter, configurations included in the display apparatus 1 will be described in more detail according to a stacked structure with reference to FIG. 6.

The first substrate 100 may include glass or polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The first substrate 100 including polymer resin may be flexible, rollable, or bendable. The first substrate 100 may have a multi-layer structure including a layer including the above-described polymer resin and an inorganic layer (not shown). The description of the first substrate 100 may apply to the second substrate 200 described below in the same way.

A first buffer layer 110 may reduce or prevent penetration of foreign materials, moisture, or external air from below the first substrate 100 and may provide a flat surface on the first substrate 100. The first buffer layer 110 may include an inorganic material, such as oxide or nitride, an organic material, or an organic-inorganic compound, and may have a single-layer or multi-layer structure including an inorganic material and an organic material. The description of the first buffer layer 110 may apply to a second buffer layer 210 described below in the same way.

A barrier layer (not shown) may be further disposed between the first substrate 100 and the first buffer layer 110. The barrier layer may prevent or reduce impurities from the first substrate 100, etc. from penetrating into the first semiconductor layer Act1 and the second semiconductor layer Act2. The barrier layer may include an inorganic material, such as oxide or nitride, an organic material, or an organic-inorganic compound, and may have a single-layer or multi-layer structure including an inorganic material and an organic material.

The first semiconductor layer Act1 and the second semiconductor layer Act2 may be disposed on the first buffer layer 110. The first semiconductor layer Act1 and the second semiconductor layer Act2 may include amorphous silicon or polysilicon. In another embodiment, the first semiconductor layer Act1 and the second semiconductor layer Act2 may include oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

Each of the first semiconductor layer Act1 and the second semiconductor layer Act2 may include a channel region, and a source region and a drain region arranged on both sides of the channel region. The first semiconductor layer Act1 and the second semiconductor layer Act2 may include a single layer or a plurality of layers.

A first gate insulating layer 111 and a second gate insulating layer 113 may be stacked over the first substrate 100 to cover the first semiconductor layer Act1 and the second semiconductor layer Act2. The first gate insulating layer 111 and the second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The description of the first gate insulating layer 111 and the second gate insulating layer 113 may apply to a third gate insulating layer 211 and a fourth gate insulating layer 213 described below in the same way.

The first gate electrode GE1 may be disposed on the first gate insulating layer 111 to at least partially overlap the first semiconductor layer Act1, and the second gate electrode GE2 may be disposed on the first gate insulating layer 111 to at least partially overlap the second semiconductor layer Act2. The first gate electrode GE1 and the second gate electrode GE2 may include molybdenum (Mo), aluminum (Al), copper (Cu), titanium (Ti), etc., and may include a single layer or a plurality of layers. As an example, the first gate electrode GE1 and the second gate electrode GE2 may include a single Mo layer.

Although FIG. 6 shows the first gate electrode GE1 and the second gate electrode GE2 disposed on the first gate insulating layer 111, in another embodiment, the first gate electrode GE1 and the second gate electrode GE2 may be disposed on the second gate insulating layer 113.

In an embodiment, the storage capacitor Cst may include the first electrode CE1 and the second electrode CE2, and may overlap the first transistor T1 as shown in FIG. 6. For example, the first gate electrode GE1 of the first transistor T1 may serve as the first electrode CE1 of the storage capacitor Cst. In another embodiment, the storage capacitor Cst may not overlap the first transistor T1 and may exist separately.

The second electrode CE2 of the storage capacitor Cst may overlap the first electrode CE1 with respect to the second gate insulating layer 113 therebetween and forms capacitance. In this case, the second gate insulating layer 113 may serve as a dielectric layer of the storage capacitor Cst.

The second electrode CE2 of the storage capacitor Cst may be disposed on the second gate insulating layer 113. The second electrode CE2 of the storage capacitor Cst may include a conductive material including molybdenum (Mo), aluminum (Al), copper (Cu), titanium (Ti), etc., and may have a multi-layer or single-layer structure including the above-described material.

A first interlayer insulating layer 115 may be provided over the second gate insulating layer 113 to cover the second electrode CE2 of the storage capacitor Cst. The first interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The description of the first interlayer insulating layer 115 may apply to a second interlayer insulating layer 215 described below in the same way.

The first pad electrode PEa, the first conductive line CLa, the first bridge electrode BE1, the third conductive line CLc, and the third pad electrode PEc may be disposed on the first interlayer insulating layer 115. The first pad electrode PEa, the first conductive line CLa, the first bridge electrode BD, the third conductive line CLc, and the third pad electrode PEc may include a conductive material including molybdenum (Mo), aluminum (Al), copper (Cu), titanium (Ti), etc., and may have a multi-layer or single-layer structure including the above-described material. As an example, the first pad electrode PEa, the first conductive line CLa, the first bridge electrode BE1, the third conductive line CLc, and the third pad electrode PEc may have a multi-layer structure of Ti/Al/Ti.

The first conductive line CLa may be connected to the second semiconductor layer Act2 through a contact hole formed in the first gate insulating layer 111, the second gate insulating layer 113, and the first interlayer insulating layer 115. The first bridge electrode BE1 may be connected to the second semiconductor layer Act2 through a contact hole formed in the first gate insulating layer 111, the second gate insulating layer 113, and the first interlayer insulating layer 115, and may be connected to the first gate electrode GE1 through a contact hole formed in the second gate insulating layer 113 and the first interlayer insulating layer 115. The third conductive line CLc may be connected to the second electrode CE2 through a contact hole formed in the first interlayer insulating layer 115, and may be connected to the first semiconductor layer Act1 through a contact hole formed in the first gate insulating layer 111, the second gate insulating layer 113, and the first interlayer insulating layer 115.

The first pad electrode PEa, the first conductive line CLa, the first bridge electrode BE1, the third conductive line CLc, and the third pad electrode PEc may be covered by an inorganic protective layer (not shown). The inorganic protective layer may include a single layer or a plurality of layers including silicon nitride ($SiN_x$) and silicon oxide ($SiO_x$). The inorganic protective layer may be used to cover and protect some wirings disposed on the first interlayer insulating layer 115.

The auxiliary panel 20 may be disposed on the first pad electrode PEa, the first conductive line CLa, the first bridge electrode BE1, the third conductive line CLc, and the third pad electrode PEc.

The auxiliary panel 20 may include the second substrate 200, the fourth pad electrode PEd and the sixth pad electrode PEf disposed on the second surface **200*a* of the second substrate 200, the second buffer layer 210 disposed on the third surface 200*b* of the second substrate 200, the third gate insulating layer 211 disposed on the second buffer layer 210, the fourth gate insulating layer 213 disposed on the third gate insulating layer 211, the second interlayer insulating layer 215 disposed on the fourth gate insulating layer 213, the second bridge electrode BE2 and the third bridge electrode BE3 disposed on the second interlayer insulating layer 215**, the first through electrode TEa, and the third through electrode TEc.

The fourth pad electrode PEd, the sixth pad electrode PEf, the second bridge electrode BE2, the third bridge electrode BE3, the first through electrode TEa, and the third through electrode TEc may include a conductive material including molybdenum (Mo), aluminum (Al), copper (Cu), titanium (Ti), etc., and may have a multi-layer or single-layer structure including the above-described material. As an example, the fourth pad electrode PEd, the sixth pad electrode PEf, the second bridge electrode BE2, the third bridge electrode BE3, the first through electrode TEa, and the third through electrode TEc may have a multi-layer structure of Ti/Al/Ti.

The second bridge electrode BE2 may be connected to a semiconductor layer of the second pixel circuit PCb (e.g., a semiconductor layer of a scan transistor) through a contact hole formed in the third gate insulating layer 211, the fourth gate insulating layer 213, and the second interlayer insulating layer 215. The third bridge electrode BE3 may be connected to an electrode of the second pixel circuit PCb (e.g., an electrode of a storage capacitor) through a contact hole formed in the second interlayer insulating layer 215, and may be connected to a semiconductor layer of the second pixel circuit PCb (e.g., a semiconductor layer of a driving transistor) through a contact hole formed in the third gate insulating layer 211, the fourth gate insulating layer 213, and the second interlayer insulating layer 215.

The first through electrode TEa may pass through the second substrate 200, the second buffer layer 210, the third gate insulating layer 211, the fourth gate insulating layer 213, and the second interlayer insulating layer 215 and connect the fourth pad electrode PEd and the second bridge electrode BE2 to each other. The third through electrode TEc may pass through the second substrate 200, the second buffer layer 210, the third gate insulating layer 211, the fourth gate insulating layer 213, and the second interlayer insulating layer 215 and connect the sixth pad electrode PEf and the third bridge electrode BE3 to each other.

A first planarization layer 117 may be disposed over the auxiliary panel 20. The first planarization layer 117 may cover the auxiliary panel 20. The first planarization layer 117 may cover side surfaces of the first pad electrode PEa, side surfaces of the third pad electrode PEc, side surfaces of the fourth pad electrode PEd, and side surfaces of the sixth pad electrode PEf. The first planarization layer 117 may have a single-layer or multi-layer structure including an organic material, and provides a flat top surface. The first planarization layer 117 may include a general commercial polymer, such as BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

FIG. 7 is a schematic cross-sectional view of a display apparatus according to an embodiment. Specifically, FIG. 7 is a schematic cross-sectional view of region A and a portion other than region A of FIG. 5. In FIG. 7, elements that are the same as those in FIG. 5 are designated by the same reference numerals, and thus, a repeated description thereof is omitted.

Referring to FIG. 7, the first pixel circuits PCa may be disposed on the first surface **100*a* of the first substrate 100. Each of the first pixel circuits PCa may include the second semiconductor layer Act2 and the second gate electrode GE2 overlapping the second semiconductor layer Act2**. The description of the first pixel circuit PCa may apply to the second pixel circuit PCb described below in the same way.

The second conductive line CLb may be disposed between the first gate insulating layer 111 and the second gate insulating layer 113. The second conductive line CLb may at least partially overlap the second semiconductor layer Act2. At least a portion of the second conductive line CLb overlapping the second semiconductor layer Act2 may be referred to as the second gate electrode GE2. The second conductive line CLb may include molybdenum (Mo), aluminum (Al), copper (Cu), titanium (Ti), etc., and may include a single layer or a plurality of layers. As an example, the second conductive line CLb may include a single Mo layer.

The second pad electrodes PEb may be disposed on the first interlayer insulating layer 115. The second pad electrodes PEb may be electrically connected to the first pixel circuits PCa, respectively. Each of the second pad electrodes PEb may be connected to the second conductive line CLb through a contact hole formed in the second gate insulating layer 113 and the first interlayer insulating layer 115. The second pad electrodes PEb may include a conductive material including molybdenum (Mo), aluminum (Al), copper (Cu), titanium (Ti), etc., and may have a multi-layer or single-layer structure including the above-described material. As an example, the second pad electrodes PEb may have a multi-layer structure of Ti/Al/Ti.

A gate line GL may be disposed between the third gate insulating layer 211 and the fourth gate insulating layer 213. The gate line GL may at least partially overlap a semiconductor layer of the second pixel circuit PCb (e.g., a semiconductor layer of a scan transistor). At least a portion of the gate line GL overlapping the semiconductor layer of the second pixel circuit PCb may be referred to as a gate electrode (e.g., a gate electrode of a scan transistor). The gate line GL may include molybdenum (Mo), aluminum (Al), copper (Cu), titanium (Ti), etc., and may include a single layer or a plurality of layers. As an example, the gate line GL may include a single Mo layer.

The fifth pad electrode PEe may be disposed on the second surface 200*a* of the second substrate 200. The fifth pad electrode PEe may directly contact the second pad electrode PEb arranged in region A. The fifth pad electrode PEe may be connected to the gate line GL through a second through electrode TEb. The second through electrode TEb may pass through the second substrate 200, the second buffer layer 210, and the third gate insulating layer 211 and connect the fifth pad electrode PEe and the gate line GL to each other. The second through electrode TEb may directly contact the gate line GL.

In an embodiment, the second through electrode TEb and the fifth pad electrode PEe may be integrally formed with each other. At least a portion of the fifth pad electrode PEe may be buried in a hole formed in the second substrate 200, and at least a portion of the fifth pad electrode PEe buried in the hole may be referred to as the second through electrode TEb.

The first planarization layer 117 may be disposed over the auxiliary panel 20. The first planarization layer 117 may cover the auxiliary panel 20. The first planarization layer 117 may cover side surfaces of the second pad electrode PEb arranged in region A, side surfaces of the fifth pad electrode PEe, and top and side surfaces of the second pad electrode PEb arranged other than in region A.

Figure 8:
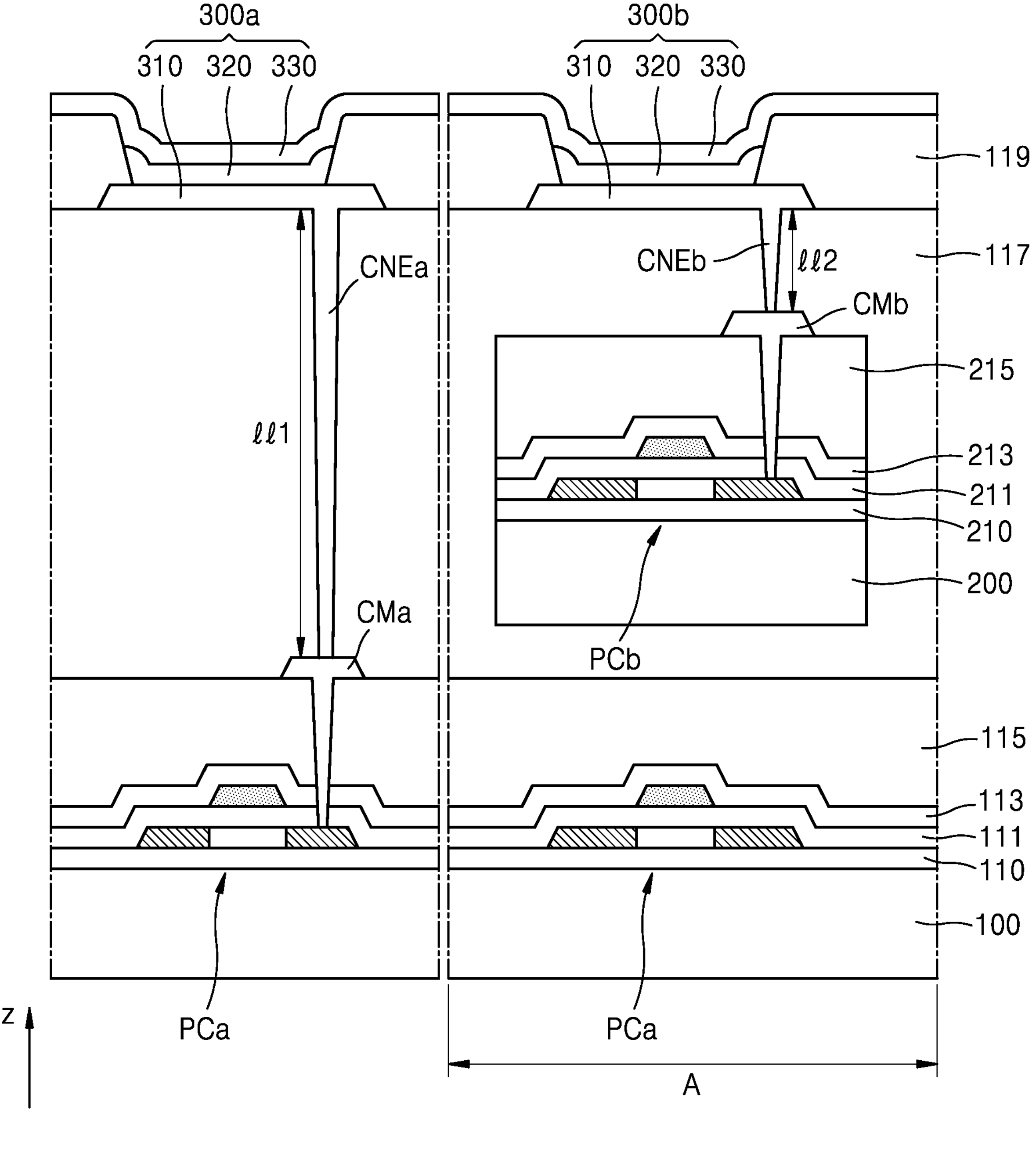
FIG. 8 is a schematic cross-sectional view of a display apparatus according to an embodiment.

FIG. 8 is a schematic cross-sectional view of a display apparatus according to an embodiment. FIG. 8 is a schematic cross-sectional view of region A and a portion other than region A of FIG. 5. In FIG. 8, elements that are the same as those in FIG. 5 are designated by the same reference numerals, and thus, a repeated description thereof is omitted.

Referring to FIG. 8, a first display element 300*a* and a second display element 300*b* may be disposed on the first planarization layer 117. Each of the first display element 300*a* and the second display element 300*b* may include a pixel electrode 310, an intermediate layer 320 including an organic emission layer, and an opposite electrode 330.

The pixel electrode 310 may be a (semi) transmissive electrode or a reflective electrode. In some embodiments, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semitransparent electrode layer on the reflective layer. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 310 may be provided in ITO/Ag/ITO.

A pixel-defining layer 119 may be disposed on the first planarization layer 117. The pixel-defining layer 119 may cover the edge of the pixel electrode 310 and may include an opening exposing the central portion of the pixel electrode 310. The pixel-defining layer 119 may prevent an arc, etc. from occurring at the edge of the pixel electrode 310 by increasing a distance between the edge of the pixel electrode 310 and the opposite electrode 330 above the pixel electrode 310. The pixel-defining layer 119 may be formed by a method, such as spin coating, using one or more organic insulating materials selected from the group including polyimide, polyamide, acrylic resin, BCB, and phenolic resin.

The intermediate layer 320 may be arranged in the opening formed by the pixel-defining layer 119 and may include an organic emission layer. The organic emission layer may include an organic material including a fluorescent or phosphorescent material that emits red, green, blue, or white light. The organic emission layer may include a low-molecular weight organic material or a polymer organic material, and functional layers, such as a hole transport layer (HTL), a hole injection layer (HIL), an electron transport layer (ETL), or an electron injection layer (EIL), may be selectively further disposed under and on the organic emission layer.

The opposite electrode 330 may be a light-transmitting electrode or a reflective electrode. In some embodiments, the opposite electrode 330 may be a transparent or semitransparent electrode and may include a metal thin film with a low work function including Li, Ca, LiF/Ca, LiF/AI, Al, Ag, Mg, and a compound thereof. In addition, a transparent conductive oxide (TCO) film, such as ITO, IZO, ZnO, or $In_2O_3$, may be further disposed on the metal thin film. The opposite electrode 330 may be arranged over the display area DA (refer to FIG. 3) and may be disposed on the intermediate layer 320 and the pixel-defining layer 119. The opposite electrode 330 may be formed as a single electrode for a plurality of display elements to correspond to a plurality of pixel electrodes.

The first display element 300*a* arranged other than in region A may be electrically connected to the first pixel circuit PCa. The first display element 300*a* may be connected to the first pixel circuit PCa through a first connection pattern CMa and a first connection electrode CNEa. The first connection pattern CMa may be disposed on the first interlayer insulating layer 115. The first connection pattern CMa may be connected to the first pixel circuit PCa through a contact hole formed in the first gate insulating layer 111, the second gate insulating layer 113, and the first interlayer insulating layer 115. The first connection electrode CNEa may pass through the first planarization layer 117 and be connected to the first connection pattern CMa. The pixel electrode 310 of the first display element 300*a* and the first connection electrode CNEa may be integrally formed with each other. At least a portion of the pixel electrode 310 of the first display element 300*a* may be buried in a hole formed in the first planarization layer 117, and at least a portion of the pixel electrode 310 of the first display element 300*a* buried in the hole may be referred to as the first connection electrode CNEa.

The second display element 300*b* arranged in region A may be electrically connected to the second pixel circuit PCb of the auxiliary panel 20. The second display element 300*b* may be connected to the second pixel circuit PCb through a second connection pattern CMb and a second connection electrode CNEb. The second connection pattern CMb may be disposed on the second interlayer insulating layer 215. The second connection pattern CMb may be connected to the second pixel circuit PCb through a contact hole formed in the third gate insulating layer 211, the fourth gate insulating layer 213, and the second interlayer insulating layer 215. The second connection electrode CNEb may pass through the first planarization layer 117 and be connected to the second connection pattern CMb. The pixel electrode 310 of the second display element 300*b* and the second connection electrode CNEb may be integrally formed with each other. At least a portion of the pixel electrode 310 of the second display element 300*b* may be buried in a hole formed in the first planarization layer 117, and at least a portion of the pixel electrode 310 of the second display element 300*b* buried in the hole may be referred to as the second connection electrode CNEb.

In an embodiment, a first length ℓℓ1 of the first connection electrode CNEa in the thickness direction (z-direction) of the first substrate 100 may be greater than a second length ℓℓ2 of the second connection electrode CNEb in the thickness direction of the first substrate 100.

The first pixel circuit PCa arranged in region A may be defective. The second pixel circuit PCb may be configured to drive the second display element 300*b* in place of the defective first pixel circuit PCa, thereby preventing reduction in yield of the display apparatus 1 due to a defect in at least one of the first pixel circuits PCa.

Because the first display element 300*a* and the second display element 300*b* including an organic emission layer may be easily damaged by external moisture or oxygen, an encapsulation layer (not shown) may cover and protect the first display element 300*a* and the second display element 300*b*. The encapsulation layer may cover the display area DA and may extend to at least a portion of the peripheral area PA (refer to FIG. 3). The encapsulation layer may include a first inorganic encapsulation layer, an organic encapsulation layer, and a second inorganic encapsulation layer.

Figure 9:
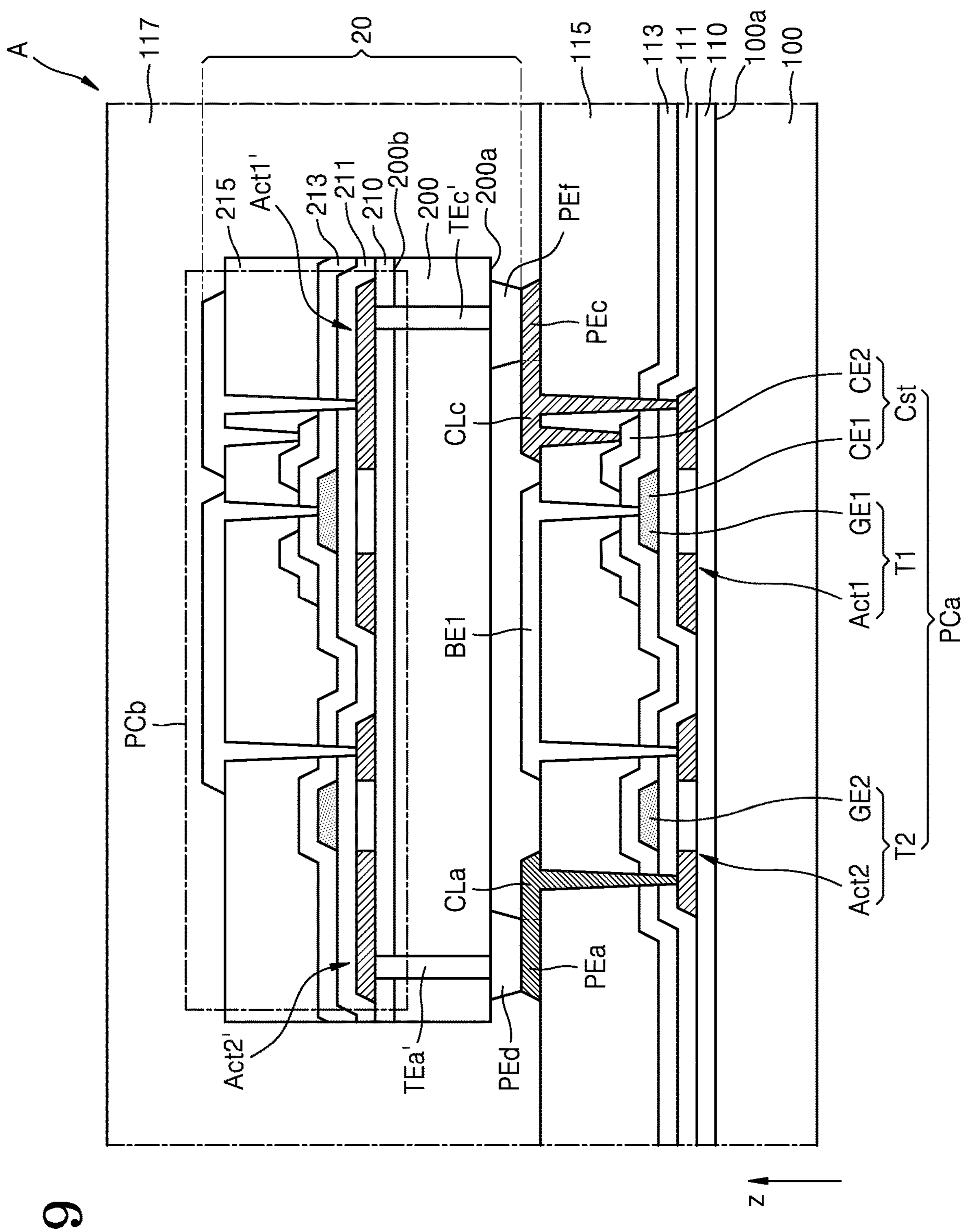
FIG. 9 is a schematic cross-sectional view of a display apparatus according to an embodiment.

FIG. 9 is a schematic cross-sectional view of a display apparatus according to an embodiment. FIG. 9 illustrates a modified embodiment of FIG. 6 and has a difference in the structure of a through electrode. Hereinafter, a redundant description thereof will be replaced with the description of FIG. 6, and differences will be mainly described.

Referring to FIG. 9, a first through electrode TEa' may directly contact a second semiconductor layer Act2' of the second pixel circuit PCb. The first through electrode TEa' may pass through the second substrate 200 and the second buffer layer 210 and connect the fourth pad electrode PEd and the second semiconductor layer Act2' of the second pixel circuit PCb to each other. As the first through electrode TEa' is connected to the second semiconductor layer Act2' of the second pixel circuit PCb, the above-described second bridge electrode BE2 of FIG. 6 may be omitted.

A third through electrode TEc' may directly contact a first semiconductor layer Act1' of the second pixel circuit PCb. The third through electrode TEc' may pass through the second substrate 200 and the second buffer layer 210 and connect the sixth pad electrode PEf and the first semiconductor layer Act1' of the second pixel circuit PCb to each other. As the third through electrode TEc' is connected to the first semiconductor layer Act1' of the second pixel circuit PCb, at least a portion of the above-described third bridge electrode BE3 of FIG. 6 may be omitted.

Figure 10:
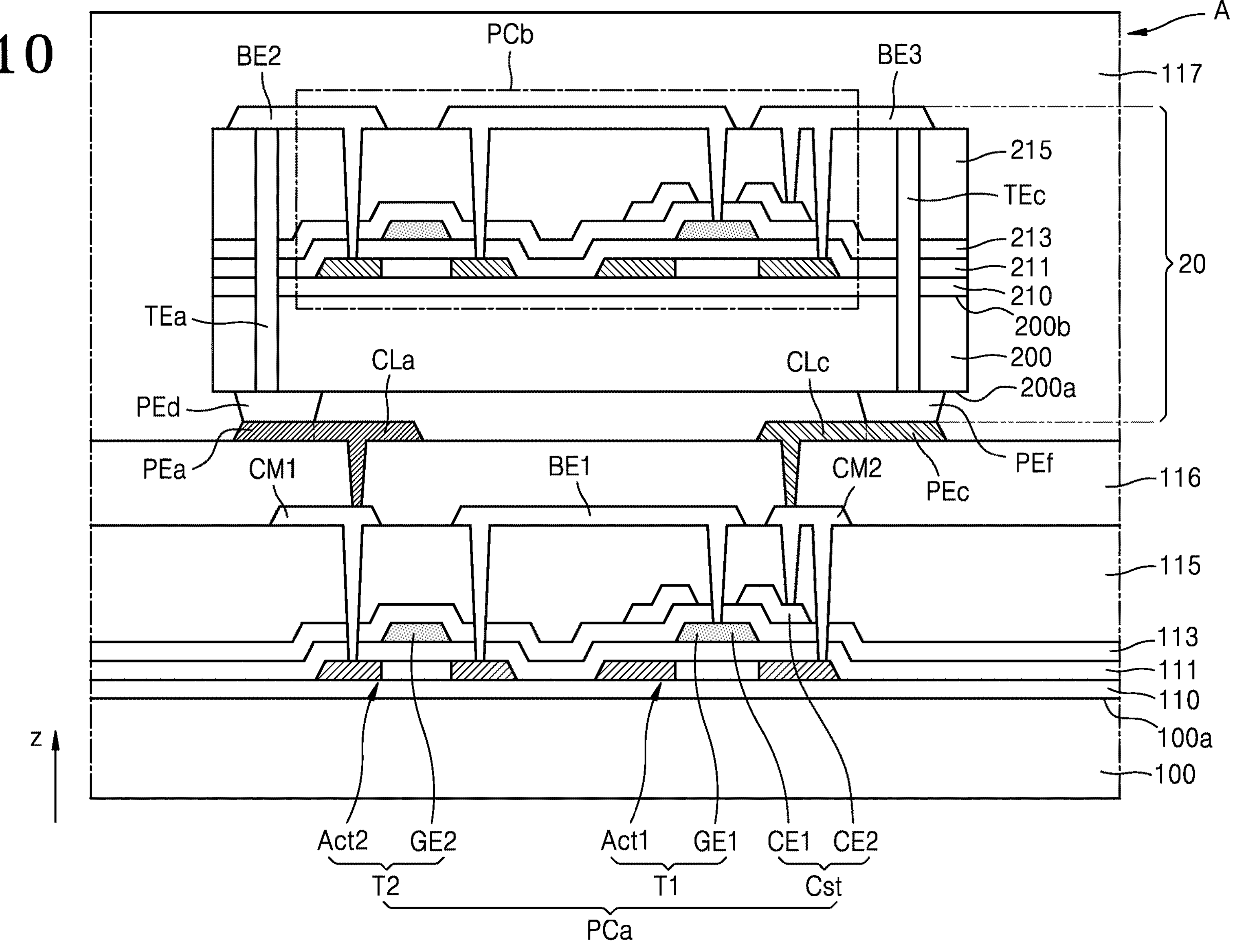
FIG. 10 is a schematic cross-sectional view of a display apparatus according to an embodiment.

FIG. 10 is a schematic cross-sectional view of a display apparatus according to an embodiment. FIG. 10 illustrates a modified embodiment of FIG. 6 and has a difference in the structure of a planarization layer. Hereinafter, a redundant description thereof will be replaced with the description of FIG. 6, and differences will be mainly described.

Referring to FIG. 10, a second planarization layer 116 may be disposed between the first interlayer insulating layer 115 and the first planarization layer 117. The second planarization layer 116 may have a single-layer or multi-layer structure including an organic material, and provides a flat top surface. The second planarization layer 116 may include a general commercial polymer, such as BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A first connection pattern CM1, the first bridge electrode BE1, and a second connection pattern CM2 may be disposed on the first interlayer insulating layer 115. The first connection pattern CM1, the first bridge electrode BE1, and the second connection pattern CM2 may include a conductive material including molybdenum (Mo), aluminum (Al), copper (Cu), titanium (Ti), etc., and may have a multi-layer or single-layer structure including the above-described material. As an example, the first connection pattern CM1, the first bridge electrode BE1, and the second connection pattern CM2 may have a multi-layer structure of Ti/Al/Ti.

The first connection pattern CM1 may be connected to the second semiconductor layer Act2 of the first pixel circuit PCa through a contact hole formed in the first gate insulating layer 111, the second gate insulating layer 113, and the first interlayer insulating layer 115. The second connection pattern CM2 may be connected to the second electrode CE2 of the storage capacitor Cst through a contact hole formed in the first interlayer insulating layer 115, and may be connected to the first semiconductor layer Act1 of the first pixel circuit PCa through a contact hole formed in the first gate insulating layer 111, the second gate insulating layer 113, and the first interlayer insulating layer 115.

The first pad electrode PEa, the first conductive line CLa, the third conductive line CLc, and the third pad electrode PEc may be disposed on the second planarization layer 116. The first conductive line CLa may be connected to the first connection pattern CM1 through a contact hole formed in the second planarization layer 116. The third conductive line CLc may be connected to the second connection pattern CM2 through a contact hole formed in the second planarization layer 116.

Figure 11:
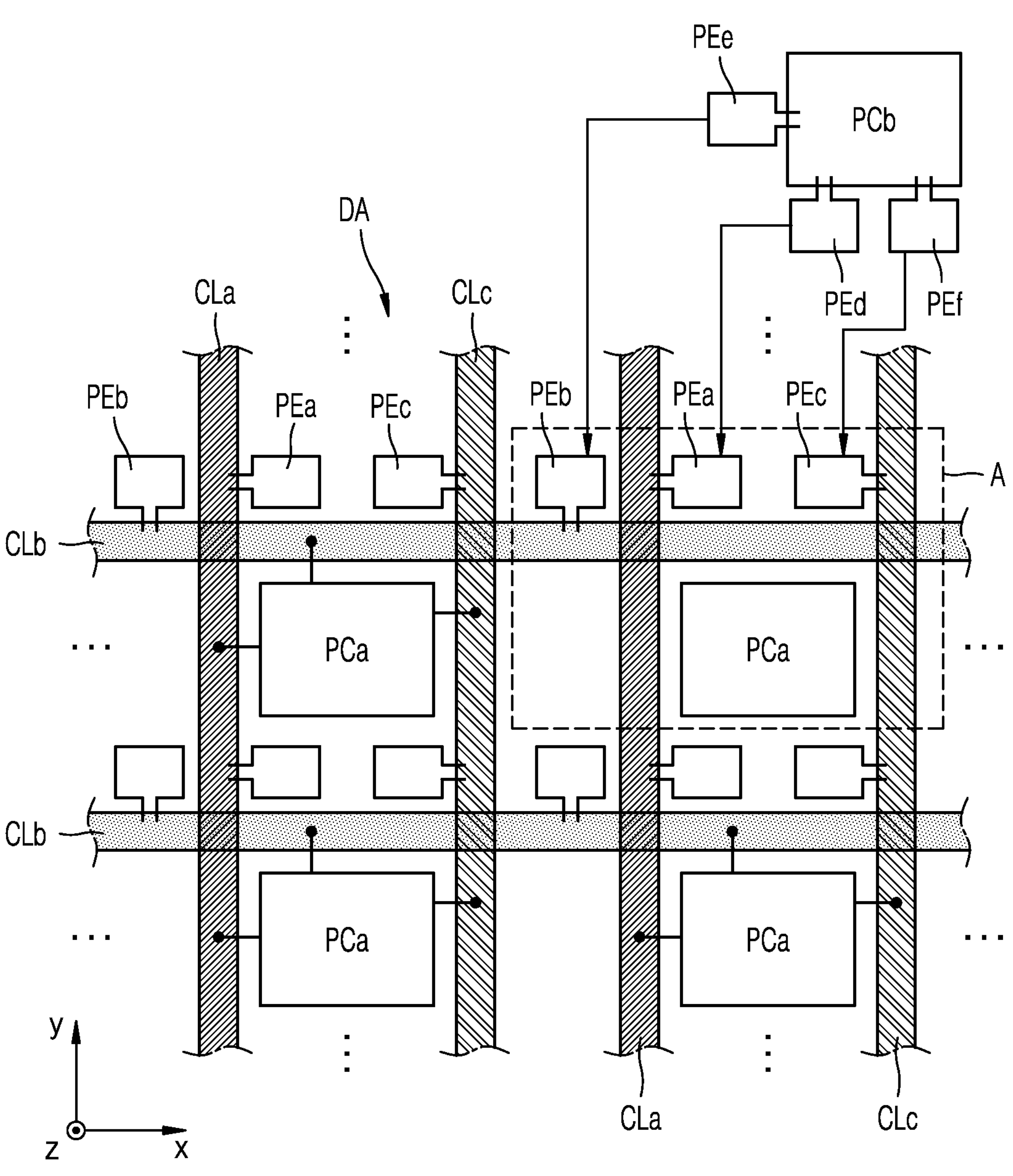
FIG. 11 is an enlarged plan view schematically showing a portion of a display apparatus according to an embodiment.

FIG. 11 is an enlarged plan view schematically showing a portion of a display apparatus according to an embodiment. FIG. 11 illustrates a modified embodiment of FIG. 5 and has a difference in the connection structure of a pixel circuit. Hereinafter, a redundant description thereof will be replaced with the description of FIG. 5, and differences will be mainly described.

Referring to FIG. 11, unlike FIG. 5 described above, the first pixel circuit PCa arranged in region A may be electrically insulated from the first conductive line CLa, the second conductive line CLb, and the third conductive line CLc. The first pixel circuit PCa arranged in region A may be electrically insulated from the first pad electrode PEa, the second pad electrode PEb, and the third pad electrode PEc. In this case, electrical signals through conductive lines may be applied in parallel to the first pixel circuit PCa and the second pixel circuit PCb arranged in region A, and thus, an increase in wiring resistance may be prevented.

While a display apparatus has been mainly described thus far, one or more embodiments are not limited thereto. For example, it will be understood that a method of manufacturing the display apparatus also falls within the scope of the disclosure.

According to one or more of the above embodiments, a display apparatus in which a defect in a pixel circuit is solved may be implemented. However, one or more embodiments are not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a first substrate including a first surface;

a first pixel circuit arranged on the first surface of the first substrate;

a second substrate arranged on the first pixel circuit and including a second surface facing the first surface and a third surface opposite the second surface;

a first pad electrode arranged between the first surface of the first substrate and the second surface of the second substrate;

a second pixel circuit arranged on the third surface of the second substrate and overlapping the first pixel circuit;

a first through electrode passing through the second substrate and electrically connected to the second pixel circuit;

a second pad electrode arranged on the second surface of the second substrate, electrically connected to the first through electrode, and contacting the first pad electrode; and a planarization layer at least partially arranged between the first surface of the first substrate and the second surface of the second substrate, wherein the second substrate and the second pixel circuit are embedded in the planarization layer.

2. The display apparatus of claim 1, further comprising:

a third pixel circuit arranged on the first surface of the first substrate;

a first display element electrically connected to the third pixel circuit; and a second display element electrically connected to the second pixel circuit.

3. The display apparatus of claim 2, further comprising:

a first connection electrode connecting the first display element to the third pixel circuit; and a second connection electrode connecting the second display element to the second pixel circuit, wherein a first length of the first connection electrode in a thickness direction of the first substrate is greater than a second length of the second connection electrode in the thickness direction of the first substrate.

4. The display apparatus of claim 2, further comprising:

a third pad electrode electrically connected to the third pixel circuit; and an insulating layer covering top and side surfaces of the third pad electrode, side surfaces of the first pad electrode, and side surfaces of the second pad electrode.

5. The display apparatus of claim 1, further comprising a first conductive line extending in a first direction and electrically connected to the first pad electrode.

6. The display apparatus of claim 5, wherein the first conductive line and the first pad electrode are arranged on a same layer or the first conductive line and the first pad electrode are integrally formed with each other.

7. The display apparatus of claim 5, wherein the first pad electrode is arranged on the first conductive line.

8. The display apparatus of claim 5, further comprising:

a third pad electrode arranged between the first surface of the first substrate and the second surface of the second substrate;

a second through electrode passing through the second substrate and electrically connected to the second pixel circuit;

a fourth pad electrode arranged on the second surface of the second substrate, electrically connected to the second through electrode, and contacting the third pad electrode; and a second conductive line extending in a second direction crossing the first direction and electrically connected to the third pad electrode.

9. The display apparatus of claim 8, wherein the second pixel circuit includes:

a driving transistor;

a scan transistor configured to transmit a data voltage to the driving transistor in response to a scan signal; and a storage capacitor comprising a first electrode connected to a gate of the driving transistor and a second electrode to which a driving voltage is applied, wherein the first conductive line transmits one of the data voltage and the driving voltage to the first pad electrode, and wherein the second conductive line transmits the scan signal to the third pad electrode.

10. The display apparatus of claim 9, further comprising:

a fifth pad electrode arranged between the first surface of the first substrate and the second surface of the second substrate;

a third through electrode passing through the second substrate and electrically connected to the second pixel circuit;

a sixth pad electrode arranged on the second surface of the second substrate, electrically connected to the third through electrode, and contacting the fifth pad electrode; and a third conductive line extending in the first direction and configured to transmit another of the data voltage and the driving voltage to the fifth pad electrode.

11. The display apparatus of claim 1, wherein the second pixel circuit includes a semiconductor layer, a gate electrode arranged on the semiconductor layer and at least partially overlapping the semiconductor layer, and a bridge electrode arranged on the gate electrode and electrically connected to the semiconductor layer, and wherein the first through electrode directly contacts the bridge electrode.

12. The display apparatus of claim 1, further comprising a gate line arranged on the third surface of the second substrate, wherein the second pixel circuit comprises a semiconductor layer, wherein the gate line at least partially overlaps the semiconductor layer, and wherein the first through electrode directly contacts the gate line.

13. The display apparatus of claim 1, wherein a planar area of the first substrate is greater than a planar area of the second substrate.

14. The display apparatus of claim 1, wherein the first pixel circuit is electrically connected to the first pad electrode.

15. The display apparatus of claim 1, wherein the first pixel circuit is electrically insulated from the first pad electrode.

* * * * *